US008677616B2

(12) United States Patent
Dooley et al.

(10) Patent No.: US 8,677,616 B2

(45) Date of Patent: Mar. 25, 2014

(54) METHOD FOR PRODUCTION OF ELECTRICAL CONDUCTORS

(75) Inventors: Kevin Allan Dooley, Mississauga (CA); Joshua Bell, Toronto (CA)

(73) Assignee: Pratt & Whitney Canada Corp., Longueuil (CA)

(*) Notice: Subject to any disclaimer, the term of this patent is extended or adjusted under 35 U.S.C. 154(b) by 394 days.

(21) Appl. No.: 12/702,455

(22) Filed: Feb. 9, 2010

(65) Prior Publication Data

US 2011/0192646 A1 Aug. 11, 2011

(51) Int. Cl.

*H04R 9/00* (2006.01)

*H05K 3/00* (2006.01)

(52) U.S. Cl.

USPC .................... 29/842; 29/843; 29/885; 164/97

(58) Field of Classification Search

USPC ................... 29/842, 598, 606, 852, 843, 885; 164/97, 98; 361/678, 694, 730, 775, 361/784

See application file for complete search history.

(56) References Cited

U.S. PATENT DOCUMENTS

| | | | | |
|---|---|---|---|---|
| 3,627,023 | A | 12/1971 | Clark et al. | |
| 3,725,843 | A | 4/1973 | Johnson | |
| 4,106,076 | A * | 8/1978 | Miller et al. | 361/694 |
| 4,241,381 | A | 12/1980 | Cobaugh et al. | |
| 5,531,021 | A | 7/1996 | Kolman et al. | |
| 5,657,811 | A * | 8/1997 | Cook | 164/97 |
| 5,705,117 | A | 1/1998 | O'Connor et al. | |
| 6,549,821 | B1 | 4/2003 | Farnworth et al. | |
| 6,845,017 | B2 | 1/2005 | Ahmed et al. | |
| 6,946,732 | B2 | 9/2005 | Akram et al. | |
| 7,002,813 | B2 | 2/2006 | Bergmann et al. | |
| 7,032,560 | B2 * | 4/2006 | Katou et al. | 123/193.5 |
| 7,193,860 | B2 | 3/2007 | Parkhill et al. | |
| 2008/0082301 | A1 | 4/2008 | Haskell et al. | |

OTHER PUBLICATIONS

Canadian Intellectual Property Office; Examiner's Requisition dated Dec. 4, 2012.

* cited by examiner

*Primary Examiner* — Thiem Phan

(74) *Attorney, Agent, or Firm* — Norton Rose Fulbright Canada LLP

(57) ABSTRACT

Matrices of multiple cast conductors, and methods for making such matrices are disclosed. Methods according to the disclosure comprise: casting a conductor matrix including a plurality of conductors joined by at least one link; applying a surface treatment to at least a portion of the matrix; finishing a contact face on at least one of the conductors; and separating the conductors from each other at the at least one link.

8 Claims, 3 Drawing Sheets

METHOD FOR PRODUCTION OF ELECTRICAL CONDUCTORS

TECHNICAL FIELD

The disclosure relates the manufacture of electrical conductors by casting.

BACKGROUND OF THE ART

Electrical power buses are used in a wide range of applications for the distribution of electrical power. Electrical conductors used as power buses have typically been manufactured individually, using conventional manufacturing processes including casting. When multiple electrical conductors are required, manufacturing the electrical conductors individually using conventional methods can be relatively time-consuming and therefore expensive.

There is a need for improved methods of manufacturing electrical conductors. In particular, there is a need for methods which improve the efficiency of casting pluralities of electrical conductors.

SUMMARY OF THE DISCLOSURE

In various aspect, the disclosure provides methods for producing pluralities of electrical conductors. Methods according to the disclosure can comprise: casting a conductor matrix including a plurality of conductors joined by at least one link; applying a surface treatment to at least a portion of the matrix; finishing a contact face on at least one of the conductors; and separating the conductors from each other at the at least one link.

In another aspect, methods according to the disclosure can comprise: casting a conductor matrix including a plurality of conjoined conductors; applying a surface treatment to at least a portion of the matrix; producing a plurality of electrical contact faces on the matrix; and separating the conductors from each other.

In further aspects, the disclosure provides matrices of commonly-cast conductors joined by links, the plurality of commonly-cast conductors comprising a plurality of electrical contact faces; and a surface treatment applied to at least a portion of the commonly-cast conductors other than the electrical contact faces.

Further details of these and other aspects of the present invention will be apparent from the detailed description and figures included below.

DESCRIPTION OF THE DRAWINGS

Reference is now made to the accompanying figures depicting aspects of the present invention, in which.

DETAILED DESCRIPTION OF THE PREFERRED EMBODIMENTS

Figure 1:
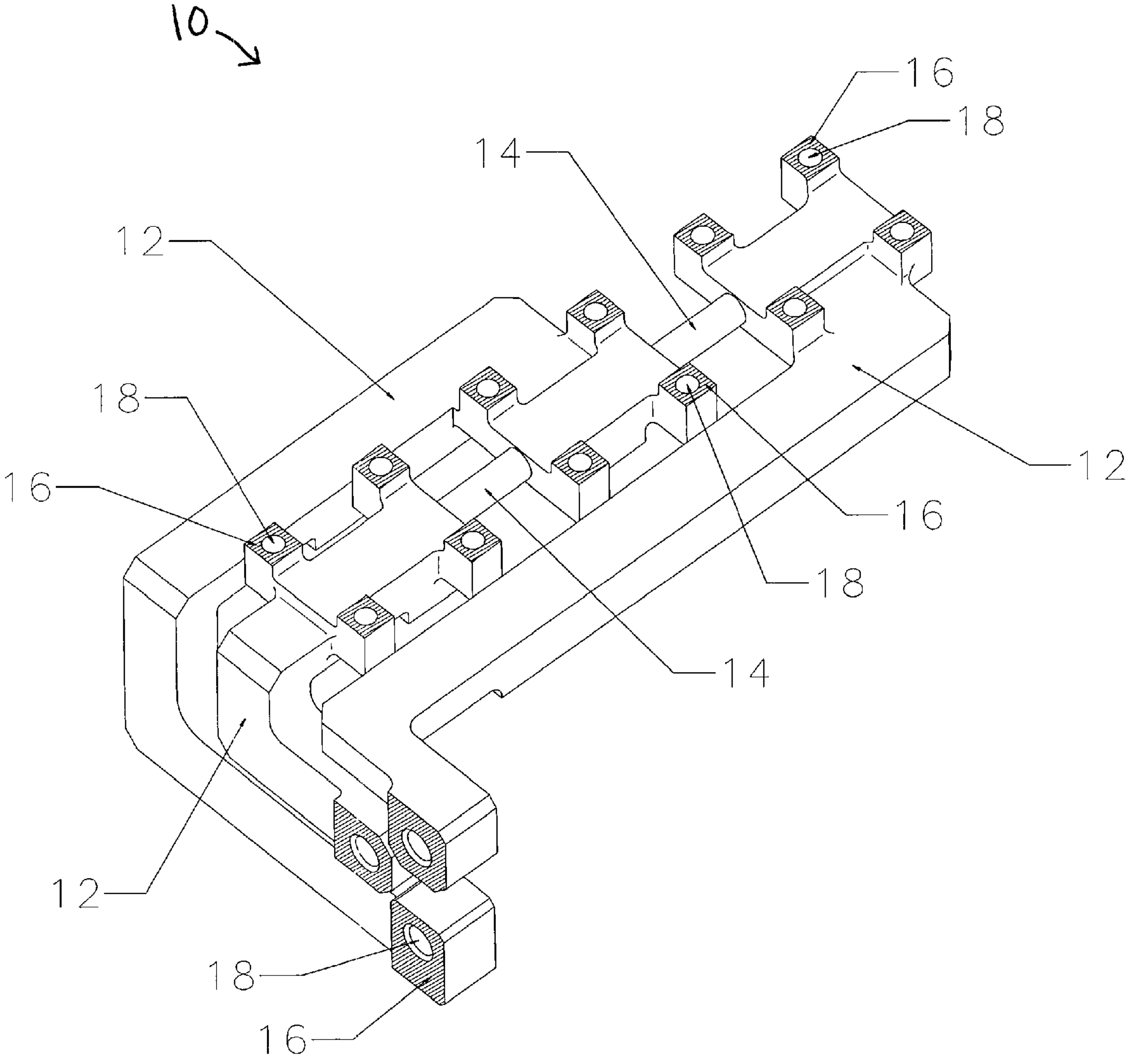
FIGS. 1 and 2 are isometric views of conductor matrices comprising pluralities of conjoined conductors according to the disclosure.
Figure 2:
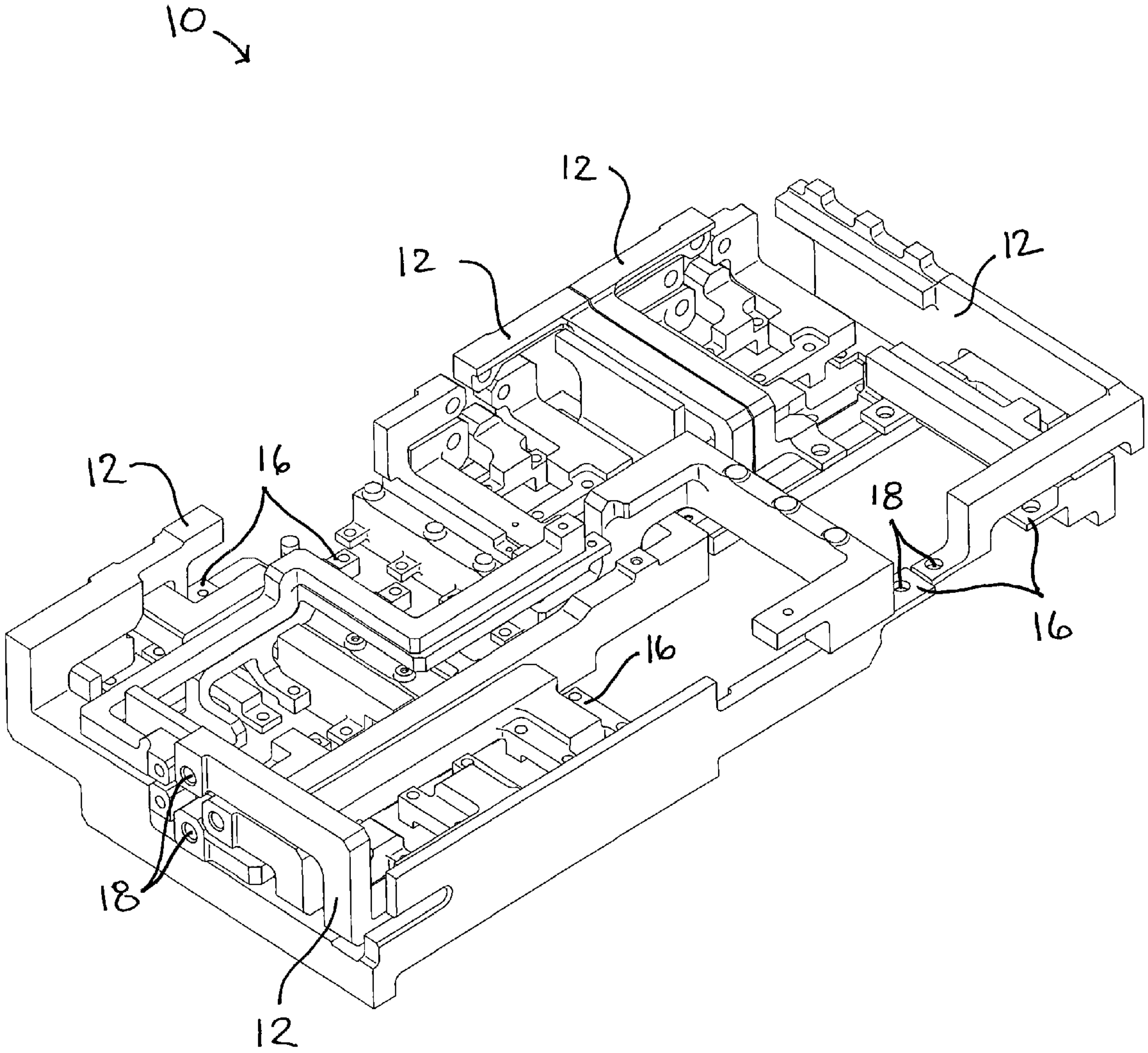

FIGS. 1 and 2 illustrate cast conductor matrices, generally shown at 10, according to the disclosure. Conductor matrices 10 each comprise a plurality of commonly-cast electrical conductors 12 conjoined by at least one temporary link, or frangible portion, 14. Conductors 12 comprise a plurality of contact faces 16. Mounting holes 18 may be disposed in or through one or more of contact faces 16.

Contact faces 16 may be intended to provide sure and efficient electrical contact between conductors 12 and other conductors 12 and/or other electrical contacts, including contacts for, for example, electrical devices such as MOSFET transitors. At least some or all of contact faces 16 may be commonly-oriented. To say that contact faces 16 are commonly oriented means that, to the extent such faces are planar, they lie in substantially parallel planes (that is, they are substantially co-planar); or, to the extent that they are not planar, axes drawn normal from their most prominent points are substantially parallel. As will be understood by those skilled in the relevant arts, terms such as 'substantially parallel' or 'substantially co-planar' mean parallel or co-planar within normal manufacturing tolerances or expectations.

Figure 3:
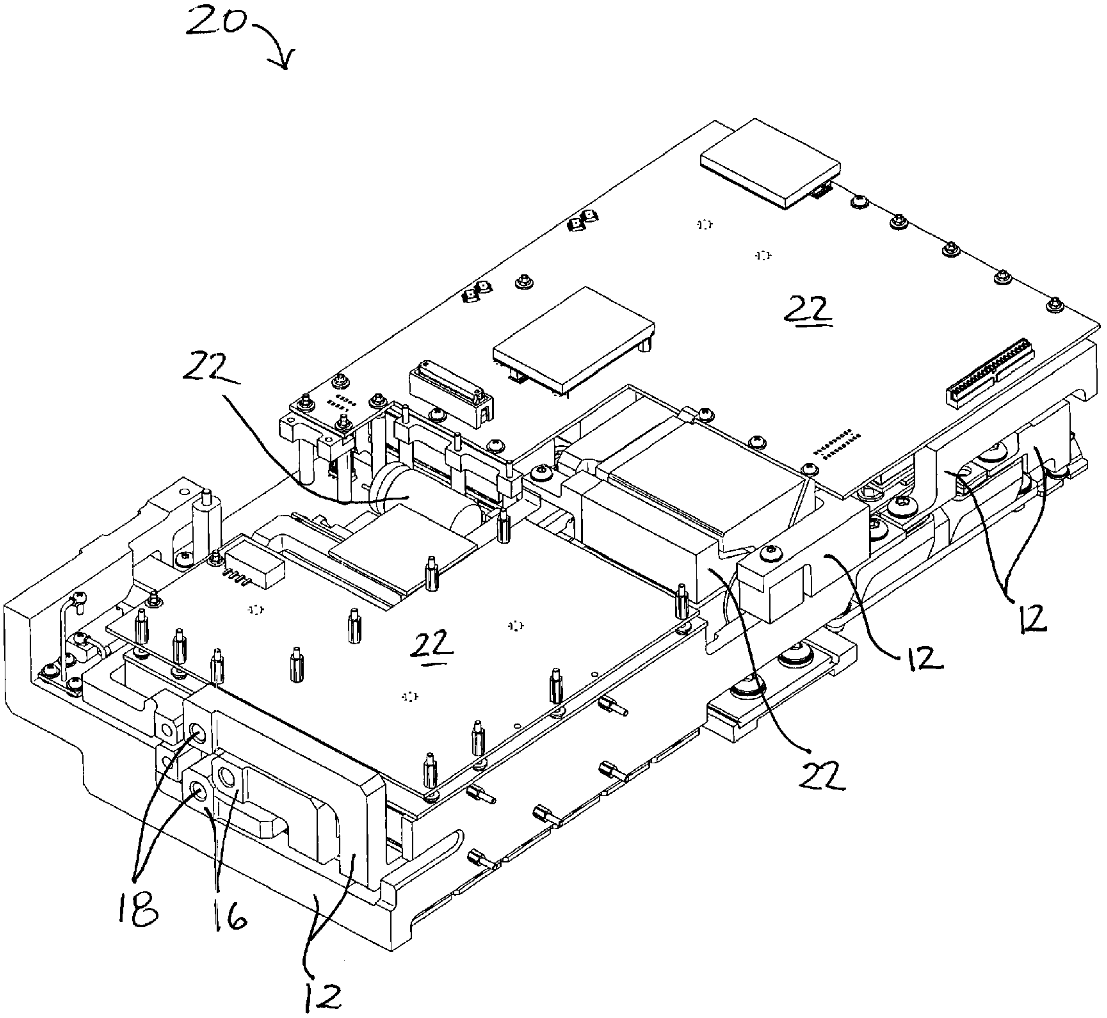
FIG. 3 is an isometric view of an electrical component comprising installed conductors manufactured in accordance with the disclosure.

FIG. 3 illustrates an electrical component such as a bus structure or other assembly, generally shown at 20, that may be produced using, for example, conductors 12 of the conductor matrix 10 of FIG. 2. Electrical bus structure 20 comprises the conductors 12 that are connected between respective electrical components 22. In addition to providing electrical connections between their respective electrical components 22, conductors 12 may also serve as part of or the entirety of the structural framework for the electrical bus structure 20, so that conductors 12 may provide desired spatial orientation and structural support for components 22 subject to gravity, magnetic forces, buffets, accelerations, or other potentially displacing loads. Electrical components 22 may include any suitable or otherwise desired electrical components, including for example MOSFET transistors; capacitors; controllers; pressure, temperature, or other transducers; data processing or communicatons components; transformers, thermostats, rheostats, etc.

Among the advantages offered by methods and devices disclosed herein are improved efficiencies and cost savings provided by common casting, machining, and finishing processes, which can be applied to multiple conductors simultaneously, particularly where relevant portions of conductors 12, including for example contact faces 16, are co-planar and/or otherwise commonly oriented.

Methods for producing pluralities of conductors 12 according to the disclosure may include, for example: casting a conductor matrix 10 of conjoined conductors 12; finishing at least a portion of the conductor matrix 10 corresponding to the contact face 16 of at least one of the conductors 12; and separating the conductors 12 from each other by, for example, severing, flexing, or otherwise breaking one or more frangible portions 14. A suitable surface treatment may be applied to at least a portion of the conductor matrix 10.

Conductor matrices 10 may be cast in accordance with the disclosure by any known or otherwise suitable processes, including for example hereafter-developed processes and the process of investment casting (such as lost-wax) where a ceramic or other suitable mold (not shown) is produced from a disposable pattern (not shown) and the conductor matrix 10 is subsequently cast in the mold. Such a pattern may represent a 3-dimensional model of the conductor matrix 10. The pattern may be designed using any suitable process, including for example suitably-implemented conventional computer aided design (CAD) systems. The pattern may be then be produced from wax using conventional methods or from a resin using a rapid prototyping system. For example, the pattern may be produced using stereolithography (SLA) and removed from the mold by burning. The conductor matrix 10 may be cast using materials suitable for use as electrical conductors such as, for example, copper, aluminum, copper alloys and aluminum alloys. Casting of the conductors 12 provides the designer with the freedom to design the shape and configuration of the conductors 12, including the orientation of contact surfaces 16, based on factors such as desired current flow, heat dissipation and assembly/packaging requirements of the electrical assembly 20. For example, as will be understood by those skilled in the relevant arts, it may be desirable to produce conductors have a varying cross-section and/or sharp or gradual corners.

Molds for conductor matrices 10 may be designed so as to facilitate casting processes and subsequent operations required to manufacture conductors 12. In order to facilitate assembly and reduce assembly times, a conductor matrix 10 may optionally be cast in the same (exact or modified) configuration and relative positioning of the conductors as they are intended to be assembled into the bus or other electrical assembly 20 (see FIGS. 2 and 3).

Links or frangible portions 14 may be provided in order to allow for several conductors to be cast together in a single step by permitting the molten material to flow in the mold and form both all of the conductors 12 in the conductor matrix 10 and optionally the frangible portions 14 as well. The number of links 14 and the configuration (size, shape, positioning) of the links 14 may be determined using conventional, new, modified, or otherwise desired mold design techniques. In some circumstances, as will be understood by those skilled in the relevant arts, conductor matrix 10 may advantageously be cast to as close to the final dimensions as possible. In the same or other circumstanes it may also be advantageous (e.g., practical and economical) to add features to the conductor matrix 10 using one or more subsequent finishing operations.

For example, finishing of one or more contact faces 16 may be required or desired to produce suitable surface properties for electrically and/or structurally connecting the conductors 12 to respective components. Finishing operations used to produce contact faces 16 may include suitable material removal processes such as machining and/or grinding. Subsequent drilling or finishing of the mounting holes 18 may also be required or desired.

Conductors 12 may be positioned in the conductor matrix 10 so as to facilitate any subsequent finishing operations. For example, the conductors 12 may be positioned to orient the contact faces 16 in a common orientation if possible, or at least in a reduced number of orientations. As previously noted, commonly-oriented faces may, for example, have normals that are substantially parallel or may include cyclindrical surfaces having central axes that are substantially parallel. The term "commonly oriented" may be used to describe surfaces that are oriented so that they can be be finished in a single setup on a finishing machine. For example, the commonly-oriented contact faces 16 in FIG. 1 may be machined in a single setup while the conductor matrix 10 is positioned and clamped on a bed of a machine tool, without requiring re-positioning and re-clamping of the conductor matrix 10 on the machine tool bed. Accordingly, the conductor matrix 10, including contact faces 16, may be configured so as to reduce the number of setups in a finishing machine. Contrary to conventional methods where conductors are manufactured individually, the above method allows for multiple conductors 12 to be cast together and also finished together in a reduced number of operations and at a reduced cost.

Conjoined conductors 12 may be separated from each other at any convenient time. For example, conjoined conductors 12 may be separated from each other during finishing processes or during assembly of the electrical bus structure or other electrical assembly 20. If the electrical components 22 can be assembled directly to the cast conductor matrix 10, the conjoined conductors 12 may alternatively be separated after assembly by cutting the links 14 using a suitable tool. Advantageously, the conductors 12 may be separated once any finishing operation has been fully or partially completed. The conductors 12 may then be connected to their corresponding electrical components 22 in order to form, for example, the electrical bus structure 20 shown in FIG. 3. The conductors 12 may be separated from each other by breaking the links 14. Depending on the configuration and properties of the links 14, the links 14 may be broken or cut using a suitable tool such as a saw or grinder.

One or more surface treatments to enhance the properties such as the corrosion resistance, surface hardness, or conductivity of conductors 12 may optionally be applied to at least a portion of the conductor matrix 10. Suitable surface treatments may include, for example, anodidization, powder or other coating or plating processes. The surface treatment may optionally be applied to the entire conductor matrix 10 prior to the finishing of the contact faces 16. Alternatively, the surface treatment may be applied to regions of the conductor matrix 10 other than the contact faces 16.

Conductors 12 may be made of any suitable material that may be cast and also be used as an electrical conductor. Conductors 12 may have any desired or required configuration(s), including for example complex geometric configurations of varying cross-section, so as to optimize their electrical and/or their structural properties. Accordingly, for example, inductive components or coils (not shown) may be formed as part of the electrical and/or structural framework of an electrical bus structure.

While the invention has been described and illustrated in connection with specific, presently-preferred embodiments, many variations and modifications may be made without departing from the spirit and scope of the invention. The invention is therefore not to be limited to the exact components or details of methodology or construction set forth above. Except to the extent necessary or inherent in the processes themselves, no particular order to steps or stages of methods or processes described in this disclosure, including the Figures, is intended or implied. In many cases the order of process steps may be varied without changing the purpose, effect, or import of the methods described. The scope of the claims is to be defined solely by the appended claims, giving due consideration to the doctrine of equivalents and related doctrines.

The invention claimed is:

1. A method for producing a plurality of electrical conductors, the method comprising:

casting a plurality of conductors together as a conductor matrix, the plurality of conductors in the matrix being joined by at least one temporary link;

applying a surface treatment to at least a portion of the matrix;

finishing a contact face on at least one of the conductors; and separating the conductors from each other at the at least one link.

2. The method as defined in claim 1, comprising finishing a plurality of commonly-oriented contact faces on the conductor matrix.

3. The method as defined in claim 1, wherein separating the conductors comprises severing the at least one link.

4. The method as defined in claim 1, wherein the surface treatment comprises anodization.

5. The method as defined in claim 1, wherein the surface treatment comprises plating.

6. The method as defined in claim 1, wherein the finishing comprises machining.

7. The method as defined in claim 1, wherein the finishing comprises grinding.

8. The method as defined in claim 1, wherein the finishing comprises removing material from the at least one of the conductors.

* * * * *